(12) United States Patent
Christensen et al.

(10) Patent No.: US 7,925,950 B2
(45) Date of Patent: Apr. 12, 2011

(54) IMPLEMENTING ENHANCED ARRAY ACCESS TIME TRACKING WITH LOGIC BUILT IN SELF TEST OF DYNAMIC MEMORY AND RANDOM LOGIC

(75) Inventors: Todd Alan Christensen, Rochester, MN (US); Peter Thomas Freiburger, Rochester, MN (US); Jesse Daniel Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 12/393,156

(22) Filed: Feb. 26, 2009

(65) Prior Publication Data

US 2010/0218055 A1    Aug. 26, 2010

(51) Int. Cl.
*G01R 31/28* (2006.01)
(52) U.S. Cl. .......................... 714/733; 714/718
(58) Field of Classification Search .................. 365/201; 714/724, 732, 733, 718
See application file for complete search history.

(56) References Cited

U.S. PATENT DOCUMENTS

| | | | | |
|---|---|---|---|---|
| 6,801,461 B2* | 10/2004 | Hii et al. | ........................ | 365/201 |
| 7,844,869 B2* | 11/2010 | Bushard et al. | ................ | 714/724 |
| 2005/0097418 A1* | 5/2005 | Anzou et al. | ................... | 714/733 |
| 2006/0080584 A1* | 4/2006 | Hartnett et al. | ................ | 714/733 |
| 2006/0156090 A1* | 7/2006 | Bushard et al. | ................ | 714/718 |
| 2008/0077834 A1* | 3/2008 | Khoche et al. | ................. | 714/732 |

OTHER PUBLICATIONS

U.S. Appl. No. 12/015,254, filed Jan. 16, 2008 by Louis Bernard Bushard et al. and entitled "Method and Circuit for Implementing Enhanced LBIST Testing of Paths Including Arrays".
U.S. Appl. No. 12/031,930, filed Feb. 15, 2008 by Donato O. Forlenza et al. and entitled "AC Scan Diagnostic Method and Apparatus Utilizing Functional Architecture Verification Patterns".
U.S. Appl. No. 12/250,085, filed Oct. 14, 2008 by Donato Orazio Forlenza et al. and entitled "Implementing Diagnosis of Transitional Scan Chain Defects Using LBIST Test Patterns".
U.S. Appl. No. 12/250,103, filed Oct. 2008 by Donato Orazio Forlenza et al. and entitled "Implementing Isolation of VLSI Scan Chain Defects Using ABIST Test Patterns".

* cited by examiner

*Primary Examiner* — David Ton
(74) *Attorney, Agent, or Firm* — Joan Pennington

(57) ABSTRACT

A method and circuit for implementing substantially perfect array access time tracking with Logic Built In Self Test (LBIST) diagnostics of dynamic memory array and random logic, and a design structure on which the subject circuit resides are provided. The dynamic memory array is initialized to a state for the longest read time for each bit and the dynamic memory array is forced into a read only mode. During LBIST diagnostics with the array in the read only mode, the array outputs are combined with the data inputs to provide random switching data on the array outputs to the random logic.

20 Claims, 7 Drawing Sheets

PRIOR ART

IMPLEMENTING ENHANCED ARRAY ACCESS TIME TRACKING WITH LOGIC BUILT IN SELF TEST OF DYNAMIC MEMORY AND RANDOM LOGIC

FIELD OF THE INVENTION

The present invention relates generally to the data processing field, and more particularly, relates to a method and circuit for implementing substantially perfect array access time tracking with Logic Built In Self Test (LBIST) diagnostics of dynamic memory array and random logic, and a design structure on which the subject circuit resides.

DESCRIPTION OF THE RELATED ART

When testing integrated circuits, techniques such as Array Built In Self Test (ABIST) and LBIST are used to test memory arrays and logic. It is very important to be able to test the full latch-to-latch paths that are used in the chip function at the same frequency that will be used in the system application.

If the circuits are tested at a slower frequency than normal system frequency or part of the functional path is bypassed, then there could be AC defects that would not be caught by test but result in a failing chip when exercised in the system. This is a very expensive point to find and screen the failing part.

FIG. 1 illustrates a prior art latch-bounded array integrated circuit 100 including input latches 102 to an array 104 with output latches 106. ABIST testing of the arrays is very straightforward when testing latch bounded arrays. ABIST will test the entire path and if ABIST is run at system speed, AC defects will be caught.

FIG. 2 illustrates a prior art dynamic memory array and logic integrated circuit 200 including input latches 202 to a dynamic memory array 204 with array output latches 206 and logic 208 connected to an output of the dynamic memory array 204 with output latches 210 connected to an output of the logic 208.

For test paths of arrays that are not output latch bounded, such as between input latches 202, dynamic memory array 204 and logic 208 and output latches 210 of integrated circuit 200, typically observation latches, such as array output latches 206 are provided so that ABIST diagnostics is straightforward for the partial AC path across array 204. Such ABIST diagnostics does not test the full AC path since the downstream logic 208 is not tested with the ABIST array path.

For LBIST, typically random patterns are scanned into banks of latches surrounding random logic and then the logic is functionally clocked and the capture latches are scanned out and the results are compared with a signature to tell if there are any AC or DC defects. LBIST in this manner is a very well understood and inexpensive way to AC and DC test integrated circuits.

Various write through and bypass methods have been developed to test the full AC latch-to-latch path including memory arrays and logic, but known arrangements fail to exactly match the access time that would be seen by the normal read access time of the array. During LBIST diagnostics, random, switching data is required on the array outputs to be able to adequately test downstream logic.

A need exists to test the full AC latch-to-latch path including memory arrays and logic.

SUMMARY OF THE INVENTION

Principal aspects of the present invention are to provide to a method and circuit for implementing substantially perfect array access time tracking with Logic Built In Self Test (LBIST) diagnostics of dynamic memory array and random logic, and a design structure on which the subject circuit resides. Other important aspects of the present invention are to provide such method, circuit and design structure substantially without negative effect and that overcome many of the disadvantages of prior art arrangements.

In brief, a method and circuit for implementing substantially perfect array access time tracking with Logic Built In Self Test (LBIST) diagnostics of dynamic memory array and random logic, and a design structure on which the subject circuit resides are provided. The dynamic memory array is initialized to a state for the longest read time for each bit and the dynamic memory array is forced into a read only mode. During LBIST diagnostics with the array in the read only mode, the array outputs are combined with the data inputs to provide random switching data on the array outputs to the random logic.

For domino read SRAM arrays, the array data is initialized to force the state of the longest read time for each bit, which generally is all zeroes or all ones.

In accordance with features of the invention, the array outputs are combined by either being ORed or ANDed with the data inputs to provide random switching data on array outputs. The method enables LBIST diagnostics to test full logic paths containing static random access memory (SRAM) arrays with domino read structures. The method allows for random logic patterns, perfect array access timings and slow cell effects to be modeled while still allowing any random logic pattern to be input to downstream logic of the SRAM arrays. Adequate testing of downstream logic using LBIST diagnostics requires random or weighted random data patterns to be input to this logic.

In accordance with features of the invention, memory arrays that are read single ended in a domino style have a state of data that is very fast since domino circuits do not switch for this state of data. The opposite state of data results in the domino circuits switching and causes long access time, which is matched by the array access time tracking of the invention.

In accordance with features of the invention, during LBIST diagnostics, when an input data latch has the data state scanned into it that matches the array data for its corresponding array data bit, then the domino circuits will switch and the resulting long access time will propagate through the read circuitry to the output of the SRAM. If an input data latch has the data state scanned into it that is the opposite state of the array data for its corresponding array data bit, then any read of the array data state will be blocked and the corresponding input latch data state will rapidly propagate to the output of the SRAM.

In accordance with features of the invention, reading the array data through the domino or dynamic read circuitry from any cell is enabled, thereby making it possible to check for slow cells and model actual AC timing, while also providing an applied random logic pattern to be propagated to the SRAM outputs and presented to downstream logic.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
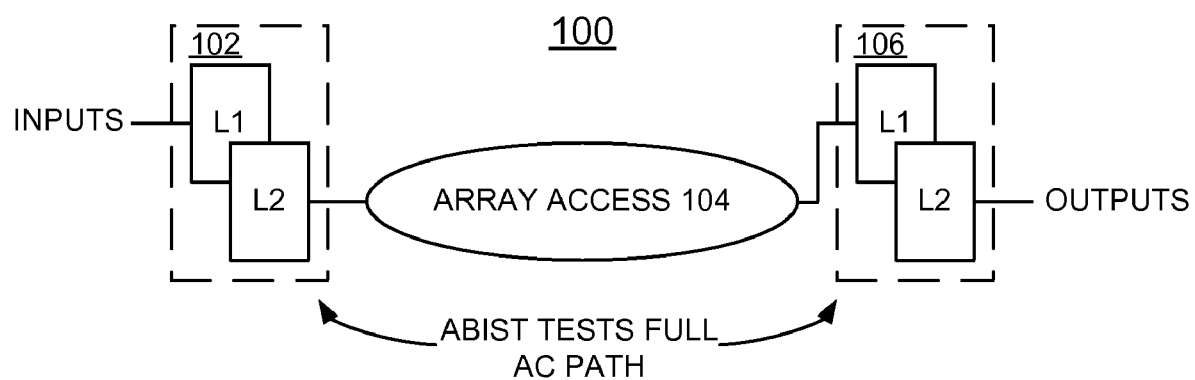
FIG. 1 illustrates a prior art circuit arrangement for implementing known testing techniques such as Array Built In Self Test (ABIST) diagnostics with a latch-bounded array.
Figure 2:
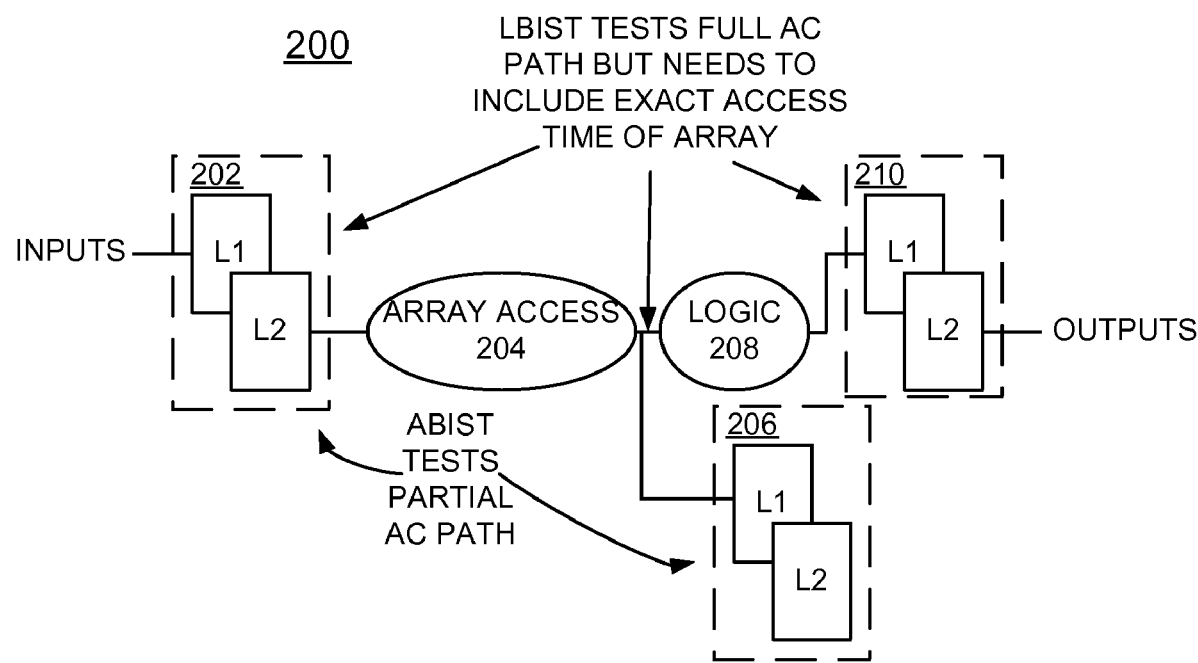
FIG. 2 illustrates a prior art circuit arrangement of dynamic memory array and random logic for implementing known testing techniques such as Logic Built in Self Test (LBIST) diagnostics for a full AC path with requirement to include exact access time of array.
Figure 3:
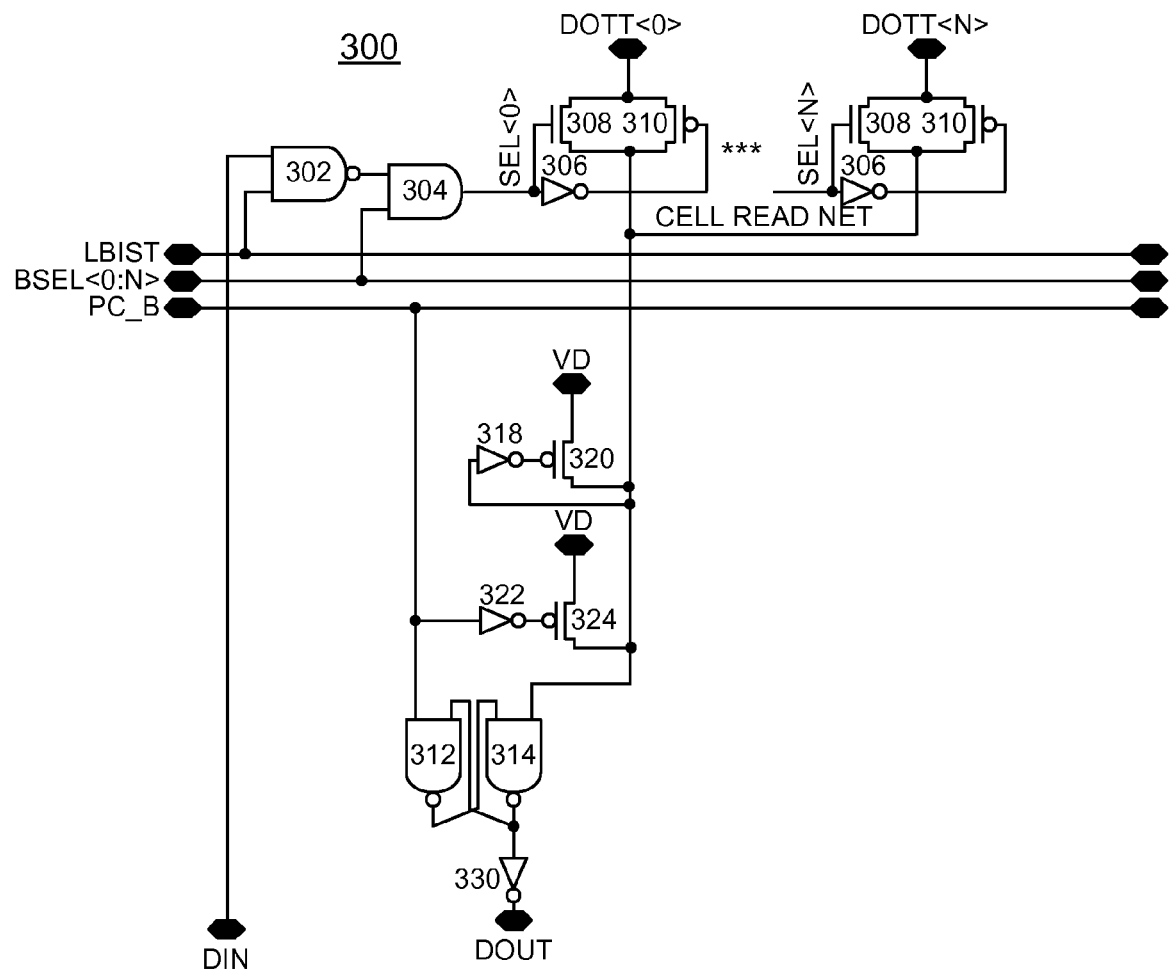
FIGS. 3 and 4 are schematic diagrams exemplary circuits for implementing array access time tracking with Logic Built In Self Test (LBIST) diagnostics of dynamic memory and random logic in accordance with the preferred embodiment.

Having reference now to the drawings, in FIG. 3, there is shown a circuit generally designated by the reference character 300 for implementing matching array access time tracking with Logic Built In Self Test (LBIST) diagnostics of dynamic memory array and logic in accordance with the preferred embodiment. The dynamic memory array and logic under test includes, for example an integrated circuit 200 as illustrated in FIG. 2.

LBIST testing circuit 300 includes a NAND gate 302 receiving a data input DIN and a test control input LBIST. The data input DIN includes an LBIST random data pattern for testing logic during LBIST diagnostics. An output of NAND gate 302 is applied to a first input of an AND gate 304 and a bit select BSEL<0:N> is applied to a second input of the AND gate 304. As shown in FIG. 3, a zero state in the memory cell will discharge the particular selected single-ended domino read input DOTT<0>-DOTT<N>.

An output of AND gate 304 is applied to a respective inverter 306 and to a gate input of a respective N-channel field effect transistor (NFET) 308. An output of the inverter 306 is applied to a gate input of a respective P-channel field effect transistor (PFET) 310. The inverter 306, the transfer gate defined by NFET 308 and PFET 310 are provided with each respective memory cell of the dynamic memory array under test. The NFET 308 and PFET 310 are connected to a respective memory cell dot line DOTT, which is typically for example, a dynamic net used for a single-ended domino read for a given select bit 0-N.

LBIST testing circuit 300 includes a pair of cross-coupled NAND gates 312, 314, providing a static signal output staying the same through a cycle, each respectively receiving an output of the other cross-coupled NAND gate applied to one input. The NAND gate 312 receives an input of a precharge signal PC_B. The NAND gate 314 receives an input of the source and drain junction connection of NFET 308 and PFET 310 at a node CELL READ NET.

LBIST testing circuit 300 includes a first inverter 318 connected to the node CELL READ NET and to a gate input of a keeper PFET 320, which is connected between a voltage supply rail VD and the node CELL READ NET input to NAND gate 314, and a second inverter 322 connected to the precharge signal net PC_B and to a gate input of a precharge PFET 324, which is connected between the voltage supply rail VD and the node CELL READ NET input to NAND gate 314. An output of the cross-coupled NAND gates 312, 314 is applied to an inverter 330, which provides a data output DOUT.

Figure 4:
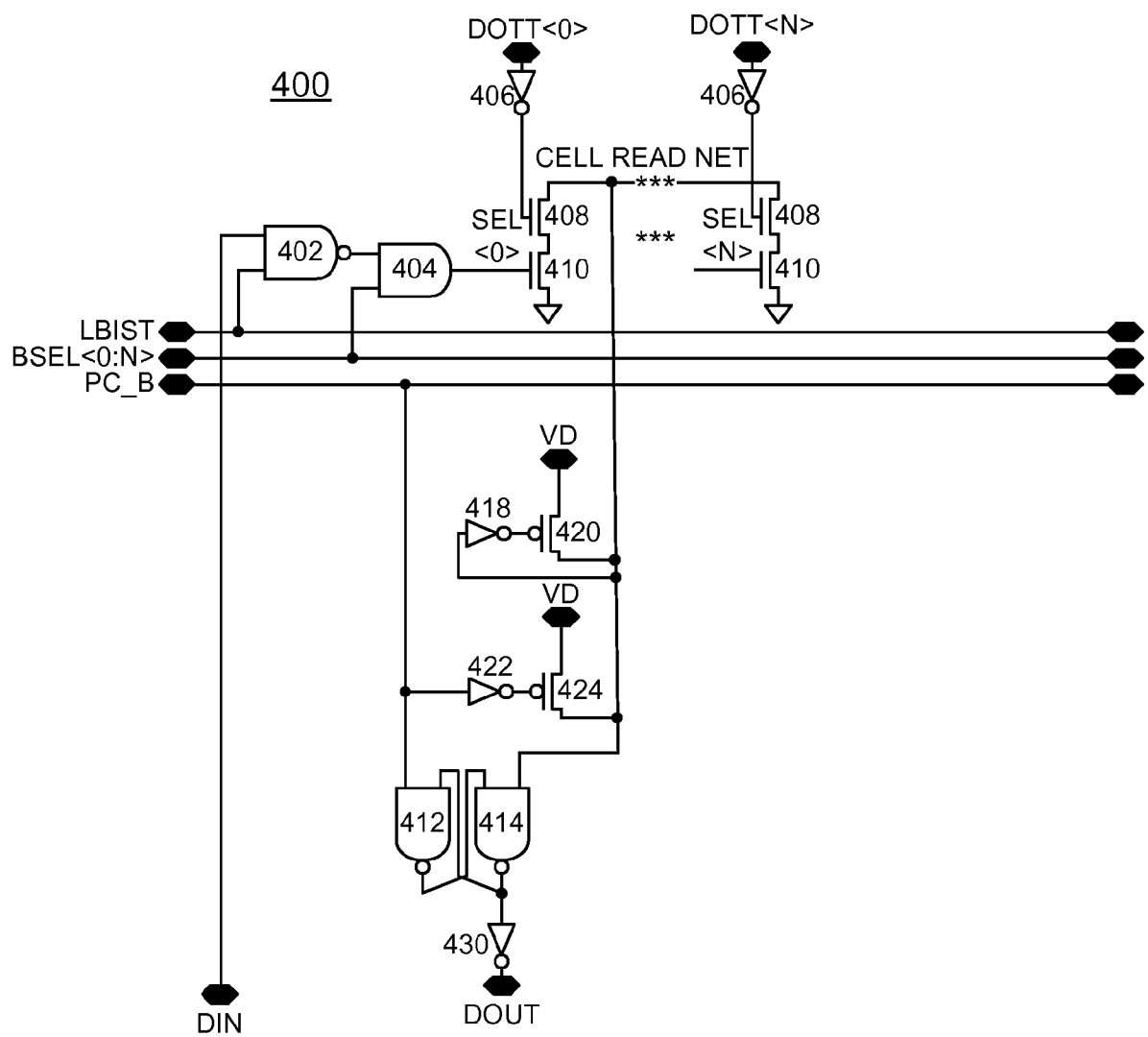

Referring also to FIG. 4, there is shown another circuit generally designated by the reference character 400 for implementing array access time tracking with Logic Built In Self Test (LBIST) diagnostics of dynamic memory and random logic in accordance with the preferred embodiment.

LBIST testing circuit 400 includes a NAND gate 402 receiving a data input DIN and an LBIST input. The data input DIN includes an LBIST random data pattern for testing logic during LBIST diagnostics. An output of NAND gate 402 is applied to a first input of an AND gate 404 and a bit select BSEL<0:N> is applied to a second input of the AND gate 404. As shown in FIG. 4, a zero state in the memory cell will discharge each single-ended domino read input DOTT<0>-DOTT<N>.

An inverter 406, a series connected NFET 408 and NFET 410 are provided with each respective memory cell group of the dynamic memory array under test. The stacked NFET 408 and NFET 410 are connected between a node CELL READ NET and ground. A gate of NFET 408 is connected by the inverter 406 to a respective memory cell dot line DOTT<0>-DOTT<N>, which is typically for example, a dynamic net used for a single-ended domino read for a given select bit 0-N. An output of AND gate 404 is applied to a gate input of a respective NFET 410.

LBIST testing circuit 400 includes a pair of cross-coupled NAND gates 412, 414 providing a static signal output staying the same through a cycle, each respectively receiving an output of the other cross-coupled NAND gate applied to an input. The NAND gate 412 receives an input of a precharge signal PC_B. The NAND gate 414 receives an input from the drain of NFET 408 at node CELL READ NET.

LBIST testing circuit 400 includes a first inverter 418 connected to the node CELL READ NET and to a gate input of a keeper PFET 420, which is connected between a voltage supply rail VD and the node CELL READ NET input to NAND gate 414, and a second inverter 422 connected to the precharge signal PC_B and to a gate input of a precharge PFET 424, which also is connected between the voltage supply rail VD and the node CELL READ NET input to NAND gate 414. An output of the cross-coupled NAND gates 412, 414 is applied to an inverter 440, which provides a data output DOUT.

Figure 5:
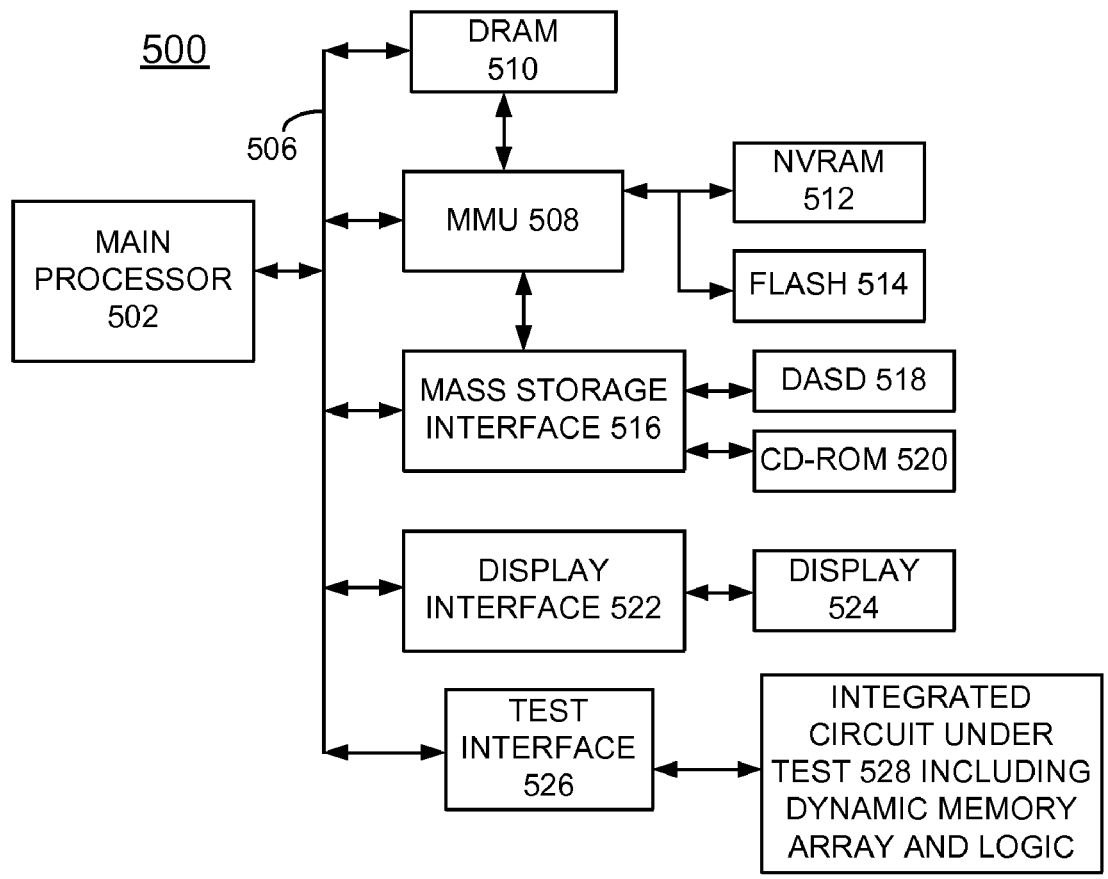
FIGS. 5 and 6 are block diagram representations illustrating a computer system and operating system for implementing array access time tracking with Logic Built In Self Test (LBIST) diagnostics of dynamic memory and random logic in accordance with the preferred embodiment.
Figure 6:
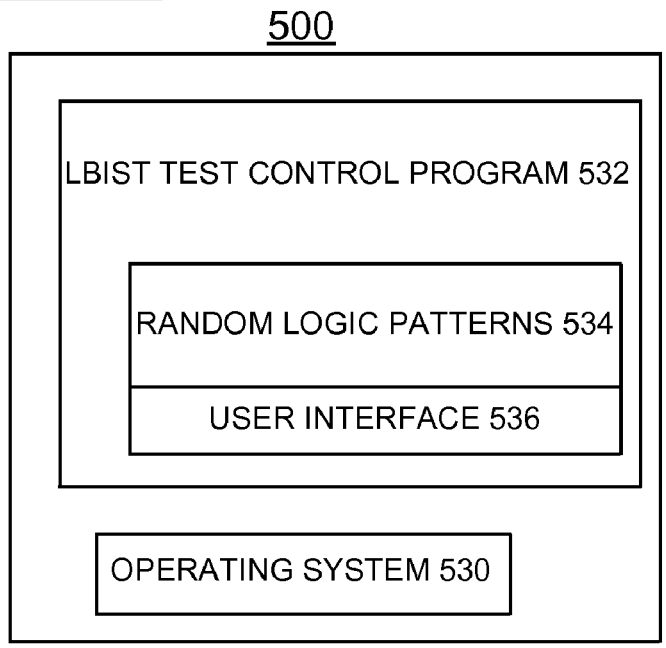

Referring to FIGS. 5 and 6, there is shown a computer test system for implementing array access time tracking with Logic Built In Self Test (LBIST) diagnostics of dynamic memory array and logic generally designated by the reference character 500 in accordance with the preferred embodiment. Computer system 500 includes a main processor 502 or central processor unit (CPU) 502 coupled by a system bus 506 to a memory management unit (MMU) 508 and system memory including a dynamic random access memory (DRAM) 510, a nonvolatile random access memory (NVRAM) 512, and a flash memory 514. A mass storage interface 516 coupled to the system bus 506 and MMU 508 connects a direct access storage device (DASD) 518 and a CD-ROM drive 520 to the main processor 502.

Computer system 500 includes a display interface 522 connected to a display 524, and a test interface 526 coupled to the system bus 506. An integrated circuit under test 528 including a dynamic memory array and logic is coupled to the test interface 526. The integrated circuit under test 528 including for example, a dynamic memory array 204 and logic 208 of the integrated circuit 200 as illustrated in FIG. 2.

As shown in FIG. 6, computer system 500 includes an operating system 530, an LBIST test control program 532, and a plurality of random logic patterns 534 of the preferred embodiment for implementing LBIST diagnostics of dynamic memory array and logic integrated circuit under test 528.

Computer test system 500 is shown in simplified form sufficient for understanding the present invention. The illustrated computer test system 500 is not intended to imply architectural or functional limitations. The present invention can be used with various hardware implementations and systems and various other internal hardware devices, for example, multiple main processors.

In accordance with features of the invention, memory arrays that are read single ended in a domino style have a state of data that is very fast since domino circuits do not switch for this state of data. The opposite state of data results in the domino circuits switching and causes long access time, which is perfectly matched by the array access time tracking of the invention.

In accordance with features of the invention, during LBIST diagnostics, when an input data latch has the data state scanned into it that matches the array data for its corresponding array data bit, then the domino circuits will switch and the resulting long access time will propagate through the read circuitry to the output of the SRAM. If an input data latch has the data state scanned into it that is the opposite state of the array data for its corresponding array data bit, then any read of the array data state will be blocked and the corresponding input latch data state will rapidly propagate to the output of the SRAM. During LBIST diagnostics, the array is forced into a read only mode. If nothing else were done, the output of the memory would be a constant and would not adequately test the downstream logic. Adequate testing of downstream logic using LBIST diagnostics requires random or weighted random data patterns to be input to this logic and array outputs are ORed or ANDed with the data inputs to provide random switching on the memory array outputs.

In accordance with features of the invention, reading the array data through the domino or dynamic read circuitry from any cell is enabled, thereby making it possible to check for slow cells and model actual AC timing, while also providing an applied random logic pattern to be propagated to the SRAM outputs and presented to downstream logic.

Figure 7:
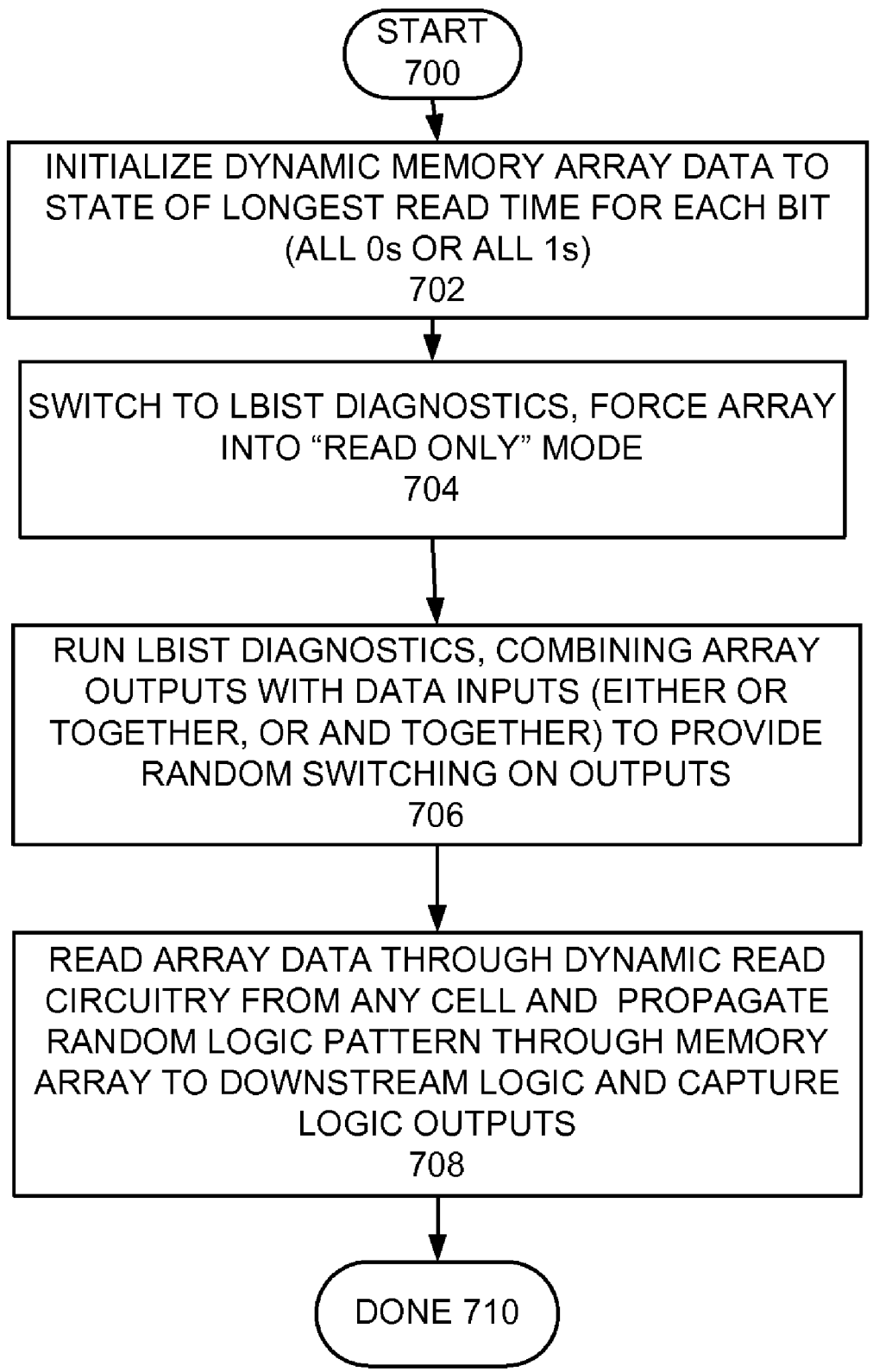
FIG. 7 is a flow chart illustrating exemplary steps for implementing array access time tracking with Logic Built In Self Test (LBIST) diagnostics of dynamic memory and random logic in accordance with the preferred embodiment.

Referring now to FIG. 7, there is a flow chart illustrating exemplary steps for implementing array access time tracking with Logic Built In Self Test (LBIST) diagnostics of dynamic memory and random logic in accordance with the preferred embodiment starting at a block 700. First the dynamic memory array data is initialized to a state of the longest read time for each bit, which is typically all zeroes or all ones as indicated at a block 702.

As indicated at a block 704 switching to LBIST diagnostics is provided and the array is forced into a read only mode. Next LBIST diagnostics are run, combining array outputs with data inputs, by either ORing the array outputs with data inputs, or ANDing the array outputs with data inputs to provide random switching on the array outputs as indicated at a block 706. As indicated at a block 708, array data is read through dynamic read circuitry from any memory cell and the random logic pattern is propagated to downstream logic, and logic outputs are captured, thereby effectively and efficiently testing both the dynamic memory array and the downstream logic.

Figure 8:
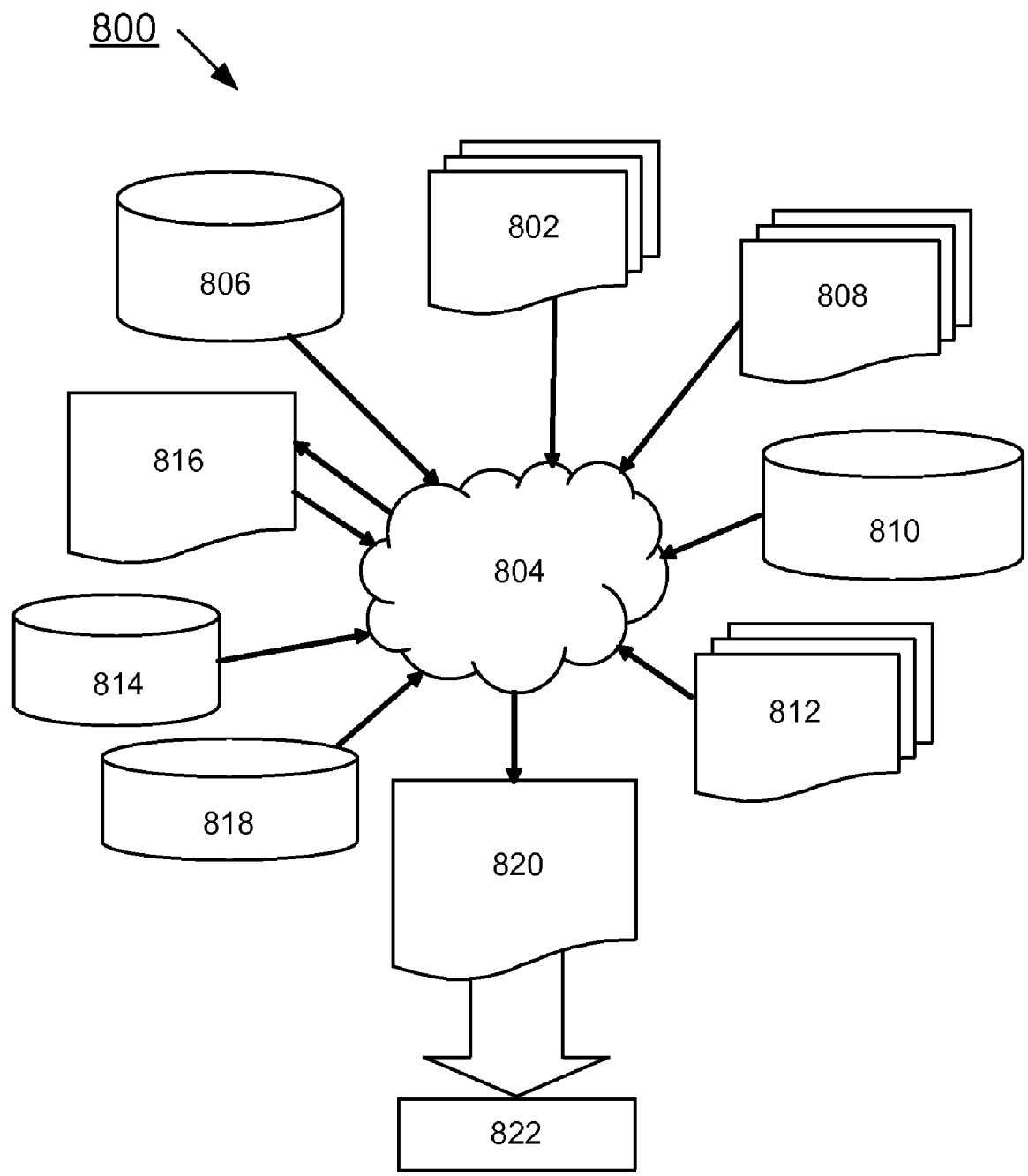
FIG. 8 is a flow diagram of a design process used in semiconductor design, manufacturing, and/or test.

FIG. 8 shows a block diagram of an example design flow 800. Design flow 800 may vary depending on the type of IC being designed. For example, a design flow 800 for building an application specific IC (ASIC) may differ from a design flow 800 for designing a standard component. Design structure 802 is preferably an input to a design process 804 and may come from an IP provider, a core developer, or other design company or may be generated by the operator of the design flow, or from other sources. Design structure 802 comprises circuits 300, 400 in the form of schematics or HDL, a hardware-description language, for example, Verilog, VHDL, C, and the like. Design structure 802 may be contained on one or more machine readable medium. For example, design structure 802 may be a text file or a graphical representation of circuits 300, 400. Design process 804 preferably synthesizes, or translates, circuits 300, 400 into a netlist 806, where netlist 806 is, for example, a list of wires, transistors, logic gates, control circuits, I/O, models, etc. that describes the connections to other elements and circuits in an integrated circuit design and recorded on at least one of machine readable medium. This may be an iterative process in which netlist 806 is resynthesized one or more times depending on design specifications and parameters for the circuits.

Design process 804 may include using a variety of inputs; for example, inputs from library elements 808 which may house a set of commonly used elements, circuits, and devices, including models, layouts, and symbolic representations, for a given manufacturing technology, such as different technology nodes, 32 nm, 45 nm, 90 nm, and the like, design specifications 810, characterization data 812, verification data 814, design rules 816, and test data files 818, which may include test patterns and other testing information. Design process 804 may further include, for example, standard circuit design processes such as timing analysis, verification, design rule checking, place and route operations, and the like. One of ordinary skill in the art of integrated circuit design can appreciate the extent of possible electronic design automation tools and applications used in design process 804 without deviating from the scope and spirit of the invention. The design structure of the invention is not limited to any specific design flow.

Design process 804 preferably translates an embodiment of the invention as shown in FIGS. 3, and 4 along with any additional integrated circuit design or data (if applicable), into a second design structure 820. Design structure 820 resides on a storage medium in a data format used for the exchange of layout data of integrated circuits, for example, information stored in a GDSII (GDS2), GL1, OASIS, or any other suitable format for storing such design structures. Design structure 820 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 3, and 4. Design structure 820 may then proceed to a stage 822 where, for example, design structure 820 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A test circuit for implementing array access time tracking with Logic Built In Self Test (LBIST) diagnostics of dynamic memory array and random logic comprising:

LBIST test control logic for initializing dynamic memory array to a state for a longest read time for each bit, forcing the dynamic memory array into a read only mode and switching to LBIST test diagnostics;

logic for combining the array outputs with the data inputs to provide random switching data to the random logic during LBIST test diagnostics.

2. The test circuit as recited in claim 1 wherein said LBIST test control logic initializes the dynamic memory array to a state of all zeroes for the longest read time for each bit.

3. The test circuit as recited in claim 1 wherein said LBIST test control logic initializes the dynamic memory array to a state of all ones for the longest read time for each bit.

4. The test circuit as recited in claim 1 includes a memory storing a random logic pattern applied to a data input during LBIST test diagnostics with the array in the read only mode.

5. The test circuit as recited in claim 1 wherein said logic for combining the array outputs with the data inputs to provide random switching data on the array outputs to the random logic during LBIST test diagnostics with the array in the read only mode includes a NAND gate receiving a random logic pattern data input and an LBIST control input.

6. The test circuit as recited in claim 5 wherein said logic for combining the array outputs with the data inputs to provide random switching data on the array outputs to the random logic during LBIST test diagnostics with the array in the read only mode includes an AND gate receiving an output of said NAND gate and a bit select input.

7. The test circuit as recited in claim 6 further includes a respective transfer gate coupled to a respective read data array output and said AND gate providing a select signal input to said respective transfer gate.

8. The test circuit as recited in claim 7 includes a respective inverter coupling an inverted select signal to said respective transfer gate.

9. The test circuit as recited in claim 6 further includes a respective pair of stacked N-channel field effect transistors (NFETs) coupled to a respective read data array output and said AND gate providing select input to said respective stacked NFETs.

10. The test circuit as recited in claim 9 includes a respective coupling said respective read data array output to said respective stacked NFETs.

11. The test circuit as recited in claim 6 further includes further includes a pair of cross-coupled NAND gates receiving a read array input signal and a precharge input signal and providing a static data read array output signal.

12. A method for implementing array access time tracking with Logic Built In Self Test (LBIST) diagnostics of dynamic memory array and random logic comprising the steps of:

initializing the dynamic memory array to a state for a longest read time for each bit, forcing the dynamic memory array into a read only mode and switching to LBIST test diagnostics;

combining the memory array outputs with the data inputs to propagate random switching data to the random logic during LBIST test diagnostics.

13. The method for implementing array access time tracking with Logic Built In Self Test (LBIST) diagnostics of dynamic memory array and random logic as recited in claim 12 wherein initializing the dynamic memory array to a state for a longest read time for each bit includes selectively initializing the dynamic memory array to a state of all zeroes for the longest read time for each bit; or selectively initializing the dynamic memory array to a state of all ones for the longest read time for each bit.

14. The method for implementing array access time tracking with Logic Built In Self Test (LBIST) diagnostics of dynamic memory array and random logic as recited in claim 12 includes applying a random logic pattern data input during LBIST test diagnostics with the array in the read only mode.

15. A design structure embodied in a machine readable medium used in a design process, the design structure comprising:

a test circuit, said test circuit for implementing array access time tracking with Logic Built In Self Test (LBIST) diagnostics of dynamic memory array and random logic, said test circuit including LBIST test control logic for initializing dynamic memory array to a state for a longest read time for each bit, forcing the dynamic memory array into a read only mode and switching to LBIST test diagnostics;

logic for combining the array outputs with the data inputs to provide random switching data on the array outputs to the random logic during LBIST test diagnostics with the array in the read only mode, wherein the design structure, when read and used in the manufacture of a semiconductor chip produces a chip comprising said test circuit.

16. The design structure of claim 15, wherein the design structure comprises a netlist, which describes said test circuit.

17. The design structure of claim 15, wherein the design structure resides on storage medium as a data format used for the exchange of layout data of integrated circuits.

18. The design structure of claim 15, wherein the design structure includes at least one of test data files, characterization data, verification data, or design specifications.

19. The design structure of claim 15, wherein said test circuit includes a NAND gate receiving a random logic pattern data input and an LBIST control input.

20. The design structure of claim 19, wherein said test circuit includes an AND gate receiving an output of said NAND gate and a bit select input.

* * * * *